(12) United States Patent
Sakata et al.

(10) Patent No.: US 7,274,223 B2
(45) Date of Patent: Sep. 25, 2007

(54) SEMICONDUCTOR DEVICE

(75) Inventors: Hiroshi Sakata, Tokyo (JP); Toru Araki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/417,253

(22) Filed: Apr. 17, 2003

(65) Prior Publication Data

US 2003/0206040 A1    Nov. 6, 2003

Related U.S. Application Data

(62) Division of application No. 10/139,750, filed on May 7, 2002, now Pat. No. 7,132,868.

(30) Foreign Application Priority Data

Jun. 27, 2001    (JP)    ............................ 2001-194904

(51) Int. Cl.
*H03K 3/00*    (2006.01)
(52) U.S. Cl. ...................... 327/108; 327/112; 327/380; 327/381; 326/82; 326/83; 326/84; 326/85; 326/92
(58) Field of Classification Search ................ 327/108, 327/109, 427, 561, 577, 309, 538, 112, 380, 327/381; 326/82, 83, 84, 85, 86, 87; 307/10.1, 307/10.7; 323/285, 284
See application file for complete search history.

(56) References Cited

U.S. PATENT DOCUMENTS

| 4,318,011 A | 3/1982 | Zeis .......................... 327/579 |
| 4,751,403 A | 6/1988 | Maekawa et al. ............. 363/21 |
| 4,837,457 A | 6/1989 | Bergstrom et al. .......... 327/482 |
| 4,890,022 A | 12/1989 | Endo .......................... 327/261 |
| 5,365,397 A | 11/1994 | Kadota .......................... 361/93 |
| 5,396,117 A * | 3/1995 | Housen et al. .............. 327/480 |
| 5,422,593 A * | 6/1995 | Fujihira ...................... 327/561 |
| 5,422,662 A * | 6/1995 | Fukushima et al. ......... 347/211 |
| 5,546,042 A * | 8/1996 | Tedrow et al. .............. 327/538 |
| 5,592,058 A * | 1/1997 | Archer et al. ............... 318/254 |
| 5,616,970 A | 4/1997 | Dittrich ...................... 307/126 |
| 5,834,955 A | 11/1998 | Eichfeld et al. ............. 363/21 |
| 6,057,728 A | 5/2000 | Igarashi ...................... 327/546 |
| 6,137,077 A | 10/2000 | Moro et al. ................. 219/108 |

(Continued)

FOREIGN PATENT DOCUMENTS

DE    37 42 075    6/1988

(Continued)

*Primary Examiner*—Tuan T. Lam
*Assistant Examiner*—Hiep Nguyen
(74) *Attorney, Agent, or Firm*—Oblon, Spivak, McClelland, Maier & Neustadt, P.C.

(57) ABSTRACT

As devices are often different in the characteristics from one another, semiconductor chips based on the devices have discrepancies in the performance. A semiconductor device having a semiconductor switching element and a drive controlling means (1) for generating from input signals (A) and (B) drive signals (a) and (b) to control the action of the semiconductor switching element is provided comprising a characteristic compensating means (2) for generating from a characteristic compensation input signal a compensation signal to eliminate variations in the transmission delay time of the drive controlling means (1).

12 Claims, 10 Drawing Sheets

U.S. PATENT DOCUMENTS

| | | | |
|---|---|---|---|
| 6,140,928 A * | 10/2000 | Shibuya et al. | 340/636 |
| 6,175,928 B1 | 1/2001 | Liu et al. | 713/401 |
| 6,194,884 B1 * | 2/2001 | Kesler et al. | 323/285 |
| 6,208,041 B1 * | 3/2001 | Majumdar et al. | 307/113 |
| 6,262,618 B1 | 7/2001 | Maggiolino | 327/285 |
| 6,268,753 B1 | 7/2001 | Sandusky | 327/266 |
| 6,388,490 B2 | 5/2002 | Saeki | 327/270 |
| 6,396,249 B1 | 5/2002 | Itakura et al. | 323/273 |
| 6,396,318 B2 | 5/2002 | Saeki | 327/116 |
| 6,525,966 B1 * | 2/2003 | Hollmer et al. | 365/185.2 |
| 6,615,005 B2 | 9/2003 | Maruyama et al. | 399/67 |
| 6,630,748 B2 * | 10/2003 | Sato et al. | 307/10.1 |
| 6,630,749 B1 * | 10/2003 | Takagi et al. | 307/10.7 |
| 6,828,839 B2 | 12/2004 | Saeki | 327/269 |

FOREIGN PATENT DOCUMENTS

| | | |
|---|---|---|
| DE | 3836990 | 5/1990 |
| DE | 4137277 | 1/1993 |
| DE | 689 14 701 T2 | 8/1994 |
| DE | 19545904 | 6/1997 |
| DE | 10000020 | 7/2000 |
| DE | 100 48 433 | 4/2001 |
| EP | 61 061518 | 3/1986 |
| EP | 0 176 184 | 4/1986 |
| EP | 0 202 962 | 11/1986 |
| EP | 0 271 959 | 6/1988 |
| EP | 02 88421 | 10/1988 |
| EP | 02 88422 | 10/1988 |
| EP | 03 324 486 | 7/1989 |
| EP | 0 387 961 | 9/1990 |
| EP | 0 666 647 | 8/1995 |
| EP | 0924 860 | 6/1999 |
| JP | 3-44109 | 2/1991 |
| KR | 0103862 | 10/1993 |
| KR | 0235000 | 12/1995 |
| KR | 1998-72428 | 3/1997 |
| KR | 0291447 | 12/1998 |
| WO | WO 00/46924 | 8/2000 |

\* cited by examiner

SEMICONDUCTOR DEVICE

CROSS-REFERENCE TO RELATED APPLICATIONS

This is a Divisional of Application of application Ser. No. 10/139,750, filed May 7, 2002, now U.S. Pat. No. 7,132,868. This application is based upon and claims the benefit of priority from the prior Japanese Patent Application No. 2001-194904, the entire contents of which are incorporated herein by reference.

BACKGROUND OF THE INVENTION

The present invention relates to a circuit configuration in a semiconductor device and particularly to a circuit provided in a power module which has semiconductor switching elements of an insulating gate type such as IGBTs, for trimming electrical characteristics of the power module.

DESCRIPTION OF THE RELATED ART

FIG. 13 illustrates a power module for an inverter circuit. A drive controller circuit when receiving input signals UPin, VPin, WPin, UNin, VNin, and WNin supplies a group of IGBTs 1 to 6 with corresponding drive signals UPout, VPout, WPout, UNout, VNout, and WNout (only UPout and UNout shown in FIG. 13). While the power module shown in FIG. 13 includes a single drive controller circuit provided for driving six IGBTs, it may have two or more drive controller circuits.

Shown at the upper right of the drawing is a rectifier circuit of silicon bridge type for feeding the power module with a DC power. As a resistor Rs for current detection is installed in any emitter circuit of the IGBT2, it may produce a considerable level of current loss and preferably installed in the second emitter circuit.

FIG. 14 is a timing chart showing input and output actions of the input signals UPin and UNin. Denoted by t1 is a delay time taken from the inversion of the input signal UPin from high level to low level to the inversion of the output signal UPout from low level to high level. As apparent from an output current Iup, the IGBT1 is switched on after a delay of time tonP. The delay time t1 of the former is attributed to the drive controller circuit while the delay time tonP of the latter is a response time of the IGBT. More specifically, the IGBT1 is switched on after a time tconP from the inversion of the input signal UPin from high level to low level.

Denoted by t2 is a delay time taken from the inversion of the input signal UPin from low level to high level to the inversion of the output signal UPout from high level to low level. As apparent from an output current Iup, the IGBT1 is switched off after a delay time toffp. More particularly, the IGBT1 is switched off after a time tcoffP from the inversion of the input signal UPin from low level to high level.

Similarly, the IGBT2 is switched off after a time tcoffN (=t3+toffN) from the inversion of the input signal UNin from low level to high level. The IGBT2 is switched on after a time tconN(=t4+tonN) from the inversion of the input signal UNin from high level to low level. As explicitly shown in FIG. 14, the output signals UPout and UNout are inverted from their respective input signals UPin and UNin.

The delay times t1 to t4, tonP, toffp, toffN, and tonN are not uniform but varied depending on the drive controller circuit and the IGBTs. It is hence schemed for inhibiting the IGBT1 and the IGBT2 from switching on at the same time to have the off period of the IGBT2 set longer than the on period of the IGBT1.

For the purpose, the high level duration of the input signal UNin has to be set longer than the low level duration of the input signal UPin as shown in the drawing. This causes the input signal UNin to contain an input cancel period (Tdead), thus allowing a higher level of the inverter control action with much difficulty.

FIG. 15 illustrates an over-current protection circuit provided in the drive controller circuit shown in FIG. 13. As the sense resistor Rs connected to the IGBT2 receives a current Irs, it produces a potential VRs=Rs·Irs at one end. When the potential VRs exceeds a specific trip level, the over-current protection circuit 3' detects the generation of short-circuit and conducts its function of protection from short-circuit to stop the action of the drive controlling means 4'. However, the action of the sense resistor may hardly be uniform while the trip level determined by the over-current protection circuit 3' is inconstant. This will discourage the over-current protection thus providing inadequate protection from the short-circuit.

Moreover, the greater the gradient of the current change at the rise or fall of a corrector current of each IGBT, the more noises may be produced. The smaller the gradient, the switching loss may be increased. There is a trade-off relationship between the generation of noises and the increase of the switching loss. For compensation, each IGBT in the prior art has to be accompanied with its dedicated drive controller circuit for enduring optimum driving conditions.

SUMMARY OF THE INVENTION

The present invention has been developed for eliminating the foregoing drawbacks and its object is to provide a semiconductor device for trimming the electrical characteristics of devices to eliminate discrepancies between the devices thus enabling a higher level of inverter controlling action, a semiconductor device for carrying out the short-circuit protection and the over-temperature protection at higher precision, and a semiconductor device for favorably determining the gradient at the rise and fall of the collector current of an output device.

As a feature of the present invention defined in claim 1, a semiconductor device is provided comprising: a semiconductor switching element; a drive controlling means for controlling the action of the semiconductor switching element with the use of an input signal; and a characteristic compensating means for arbitrarily determining the transmission delay time of the drive controlling means with the use of a characteristic compensation input signal to eliminate discrepancies in the delay time of the semiconductor switching element.

As another feature of the present invention defined in claim 2, a semiconductor device is provided comprising: a semiconductor switching element; a current detecting means for detecting the current flowing across the semiconductor switching element; an over-current protecting means for canceling the action of the semiconductor switching element when the detection signal from the current detecting means exceeds a predetermined trip level; and a characteristic compensating means for modifying the trip level.

As a further feature of the present invention defined in claim 3, a semiconductor device having a semiconductor switching element and a drive controlling means for controlling the action of the semiconductor switching element based on an input signal is provided comprising a characteristic compensating means for compensating the opera tional characteristics of the semiconductor switching element through selecting and using one or more of driving devices which are provided in the drive controlling means and arranged different in the driving capability.

DETAILED DESCRIPTION OF THE PREFERRED EMBODIMENT

Embodiment 1

Figure 1:
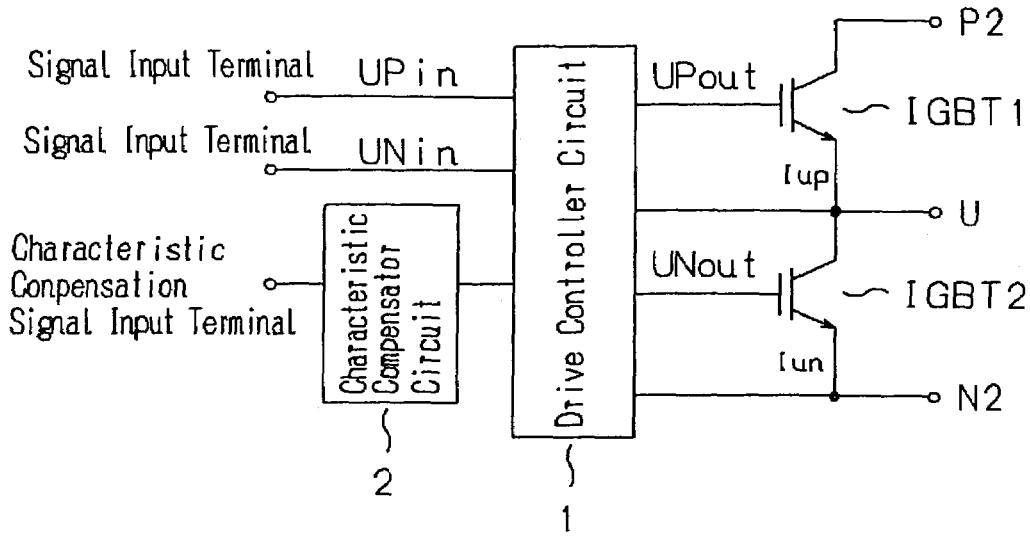
FIG. 1 is a controller block diagram showing a first embodiment of the present invention.

FIG. 1 is a controller block diagram showing the first embodiment of the present invention. A drive controller circuit 1 is responsive to the input signals UPin and UNin from signal input terminals respectively for delivering the output signals UPout and UNout to the gates of the IGBT1 and IGBT2 at the U phase which are connected in series between the output terminals P2 and N2 of the power module. FIG. 1 illustrates only the U phase although it contains identical circuits for driving the IGBT3 and IGBT4 at the V phase and the IGBT5 and IGBT6 at the W phase.

Figure 2:
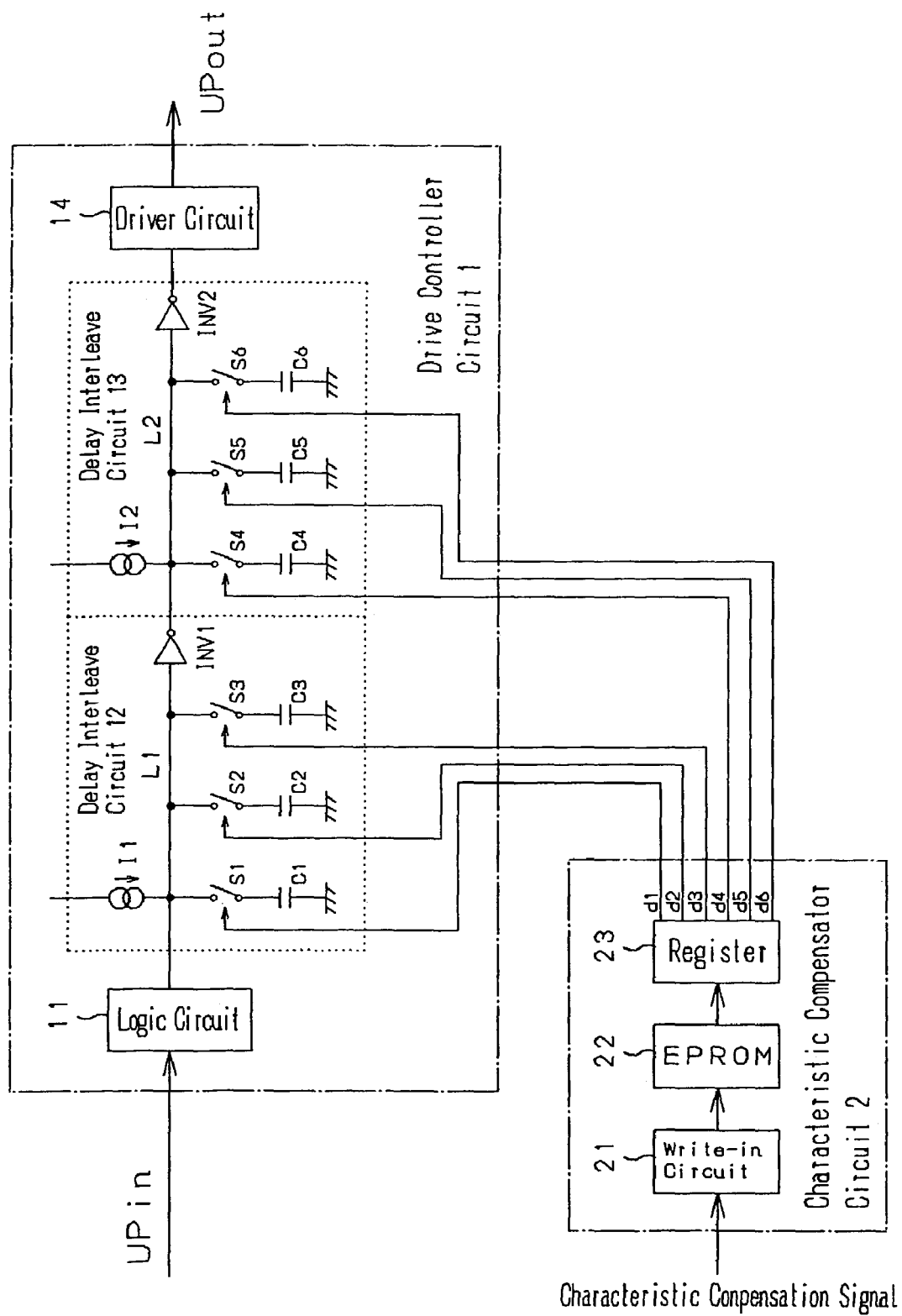
FIG. 2 is a circuit diagram having shown the details of FIG. 1.

FIG. 2 shows a detailed circuit configuration of the drive controller circuit 1 and a characteristic compensator circuit 2. The drive controller circuit 1 includes a logic circuit 11 for converting the input signal UPin into a logic signal received by the line L1 of a delay interleave circuit 12. The delay interleave circuit 12 has three capacitors C1, C2, and C3 connected with corresponding switches S1, S2, and S3 between the line L1 and the ground. The line L1 is supplied with a current I1.

The line L1 is connected via an inverter INV1 to the line L2 of another delay interleave circuit 13. Similarly, the delay interleave circuit 13 has three capacitors C4, C5, and C6 connected with corresponding switches S4, S5, and S6 between the line L2 and the ground. The line L2 is supplied with a current I2. The line L2 is further connected via an inverter INV2 to a driver circuit 14. The driver circuit 14 feeds the IGBT1 with a driving signal UPout.

The capacitors C1, C2, C3, C4, C5, and C6 may be adapted identical or different in the capacitance. The number of the grouped capacitors is not limited to three.

The characteristic compensator circuit 2 includes a write-in circuit 21 for writing a characteristic compensation signal into an EPROM 22 of which the data is then latched by a register 23. The register 23 generates and delivers latch data d1 to d6 as the driving signals to the corresponding switches S1 to S6. This allows the switches S1 to S6 to be switched on and off desirably with the characteristic compensation signal.

Figure 14:
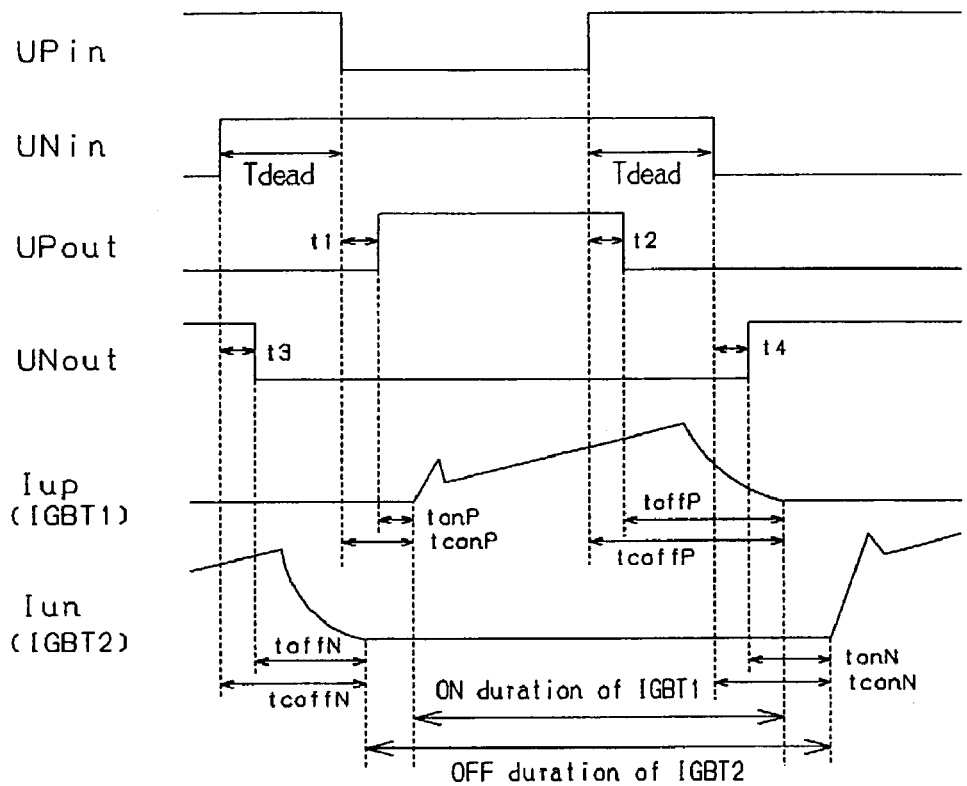
FIG. 14 is a timing chart showing input and output actions shown in FIG. 13.
Figure 15:
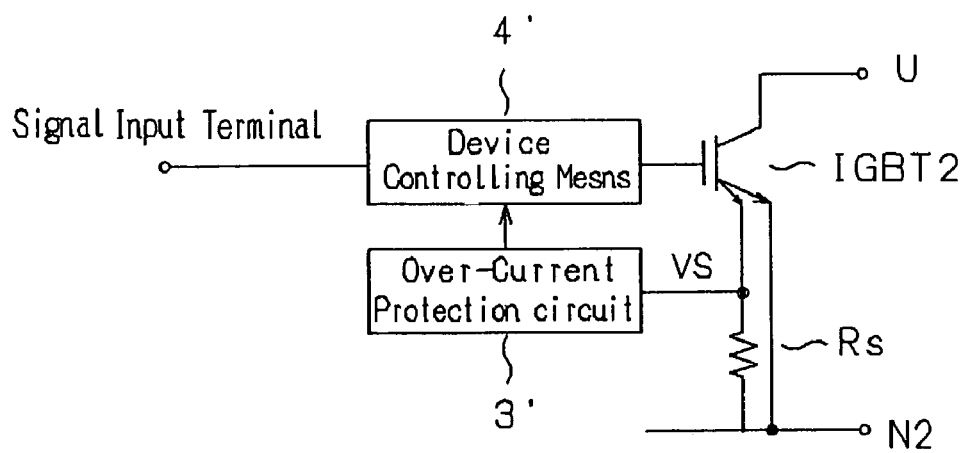
FIG. 15 is a timing chart showing an action of protecting against short-circuits.

The action of the drive controller circuit 1 shown in FIG. 2 will now be described referring to the timing chart shown in FIG. 3. The input signal UNin is different from that shown in FIG. 14 as having no input cancel period (Tdead) and being precisely synchronized with the input signal UPin which is inverted. Denoted by t11 is a delay time taken from the inversion of the input signal UPin from high level to low level to the inversion of the output signal UPout from low level to high level in the drive controller circuit 1. When the switches S1 to S3 remain switched off, the delay time in the delay interleave circuit 12 is zero and the delay time t11 is equal to the delay time t1 shown in FIG. 14.

Denoted by t12 is a delay time taken from the inversion of the input signal UPin from low level to high level to the inversion of the output signal UPout from high level to low level in the drive controller circuit 1. When the switches S4 to S6 remain switched off, the delay time in the delay interleave circuit 33 is zero and the delay time t12 is equal to the delay time t2 shown in FIG. 14.

While the drive controller circuit 1 shown in FIG. 2 illustrates one circuit for the input signal UPin, it actually includes other identical circuits (having the delay interleave circuits and the characteristic compensator circuit) for the input signals UNin, VPin, VNin, WPin, and WNin respectively. Hence, denoted by t13 is a delay time taken from the inversion of the input signal UNin from low level to high level to the inversion of the output signal UNout from high level to low level. Denoted by t14 is a delay time taken from the inversion of the input signal UNin from high level to low level to the inversion of the output signal UNout from low level to high level. Those delay times may arbitrarily be determined like t11 ad t12.

As its output signal UPout is inverted from low level to high level after the delay time t11 from the inversion of the input signal UPin from high level to low level, the IGBT1 is switched on after a period tonP (its response time). More particularly, the IGBT1 is switched on after a period tconP from the inversion of the input signal UPin from high level to low level.

On the contrary, as its output signal UPout is inverted from high level to low level after the delay time t12 from the inversion of the input signal UPin from low level to high level, the IGBT1 is switched off after a period toffP (its response time). More particularly, the IGBT1 is switched off after a period tcoffP from the inversion of the input signal UPin from low level to high level.

Similarly, as its output signal UNout is inverted from high level to low level after the delay time t13 from the inversion of the input signal UNin from low level to high level, the IGBT2 is switched off after a period toffN (its response time). More particularly, the IGBT2 is switched on after a period tcoffN from the inversion of the input signal UNin from low level to high level.

As its output signal UNout is inverted from low level to high level after the delay time t14 from the inversion of the input signal UNin from high level to low level, the IGBT2 is switched on after a period tonN (its response time). More particularly, the IGBT2 is switched off after a period tconN from the inversion of the input signal UNin from high level to low level.

Figure 3:
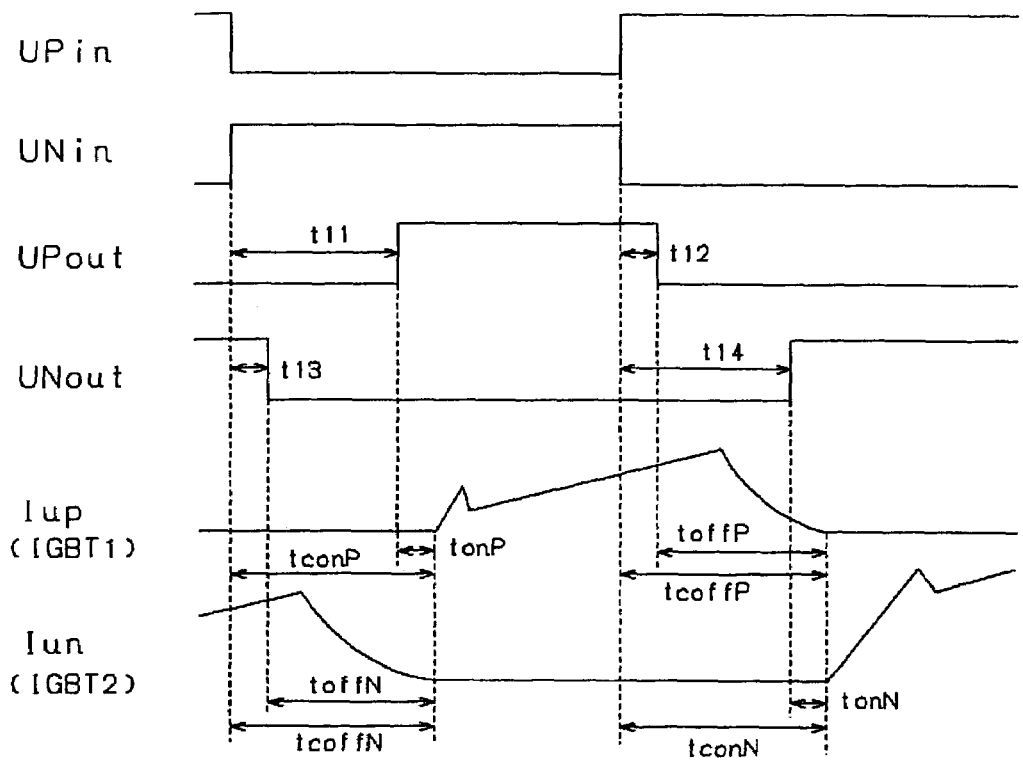
FIG. 3 is a timing chart of signals shown in FIG. 1.

Even when the two input signals UPin and UNin are synchronized with each other as shown in FIG. 3, the delay time and the response time of each IGBT are not uniform in the drive controller circuit 1 and tconP≠tcoffN is thus established. As a result, the switching on of the IGBT1 is not timed with the switching off of the IGBT2. Also, as tcoffP≠tconN is established, the switching off of the IGBT1 is not timed with the switching on of the IGBT2.

However, the delay time t11 or t13 can be adjusted by the characteristic compensation signal selecting the action of the switches between
the switching off of all the switches,
the switching on of any one of the switches,
the switching on of any two of the switches, and
the switching on of all the switches. More practically, at tconP≅tcoffN shown in FIG. 3, the IGBT1 can be switched on at the timing of switching off of the IGBT2. Similarly, as the delay times t12 and t14 are adjusted to have tcoffP≅tconN, the IGBT1 can be switched off at the timing of the switching on of the IGBT2.

When tconP≅tcoffN and tcoffP≅tconN are given, discrepancies in the delay time including the response time of the drive controller circuit 1 and the IGBTs can be eliminated in the entire arrangement of the device. This will require no use of the input cancel period (Tdead), thus allowing a higher level of the inverter controlling action. Alternatively, as the delay time is slightly drifted due to deterioration with time and temperature variation, the input cancel period Tdead may preferably be provided for offsetting the effect of drift. In that case, the period Tdead is too short as compared with that in any prior art and will hardly disturb the highly advanced inverter controlling action.

The EPROM 22 in the characteristic compensation circuit 2 may be a nonvolatile memory or one-time ROM. The characteristic compensation circuit 2 may be installed in an integrated circuit form in the drive controller circuit 1.

Embodiment 2

Figure 4:
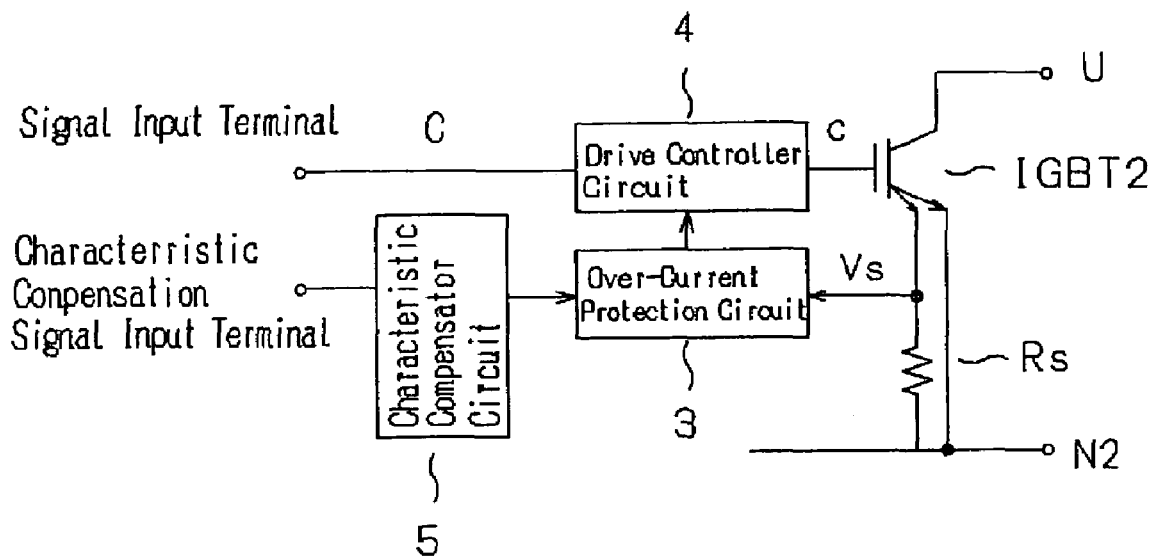
FIG. 4 is a controller block diagram showing a second embodiment of the present invention.

FIG. 4 is a controller block diagram showing the second embodiment of the present invention. A drive controller circuit 4 comprises a logic circuit 41 for transferring its input signal C as a logic signal and a driver circuit 42 arranged responsive to the logic signal for delivering a drive signal c.

An over-current protection circuit 3 includes a comparator 31 of which the non-inverting input terminal receives a voltage Vs developed at one end of a sense resistor Rs connected to the second emitter of the IGBT2. The reference voltage Vref is divided by the action of four series connected resistors into three components Vref1 to Vref3 which are selectively connected as different trip levels to the inverting input terminal of the comparator 31 by the action of three switches S1 to S3. A signal output of the comparator 31 is transferred as a disconnection signal to the logic circuit 41

A characteristic compensation circuit 5 is provided for switching on any of the switches S1 to S3 and its circuit configuration is identical to that of the characteristic compensation circuit 2 shown in FIG. 2. The characteristic compensation circuit 5 also includes an EPROM which may be a nonvolatile memory or one-time ROM. The characteristic compensation circuit 5 may be implemented in an integrated circuit form in the drive controller circuit 4.

Figure 6:
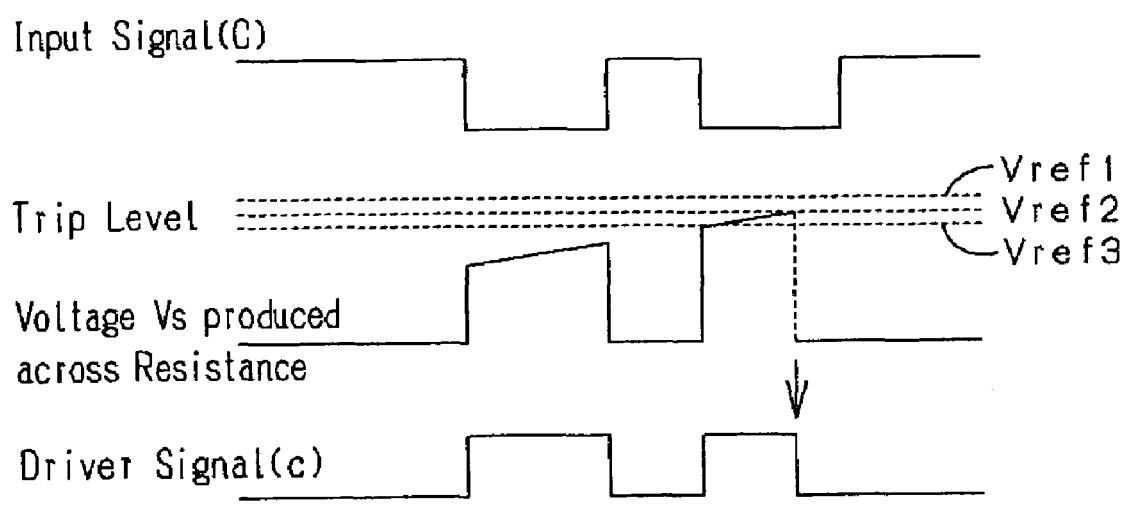
FIG. 6 is a timing chart of signals shown in FIG. 4.
Figure 5:
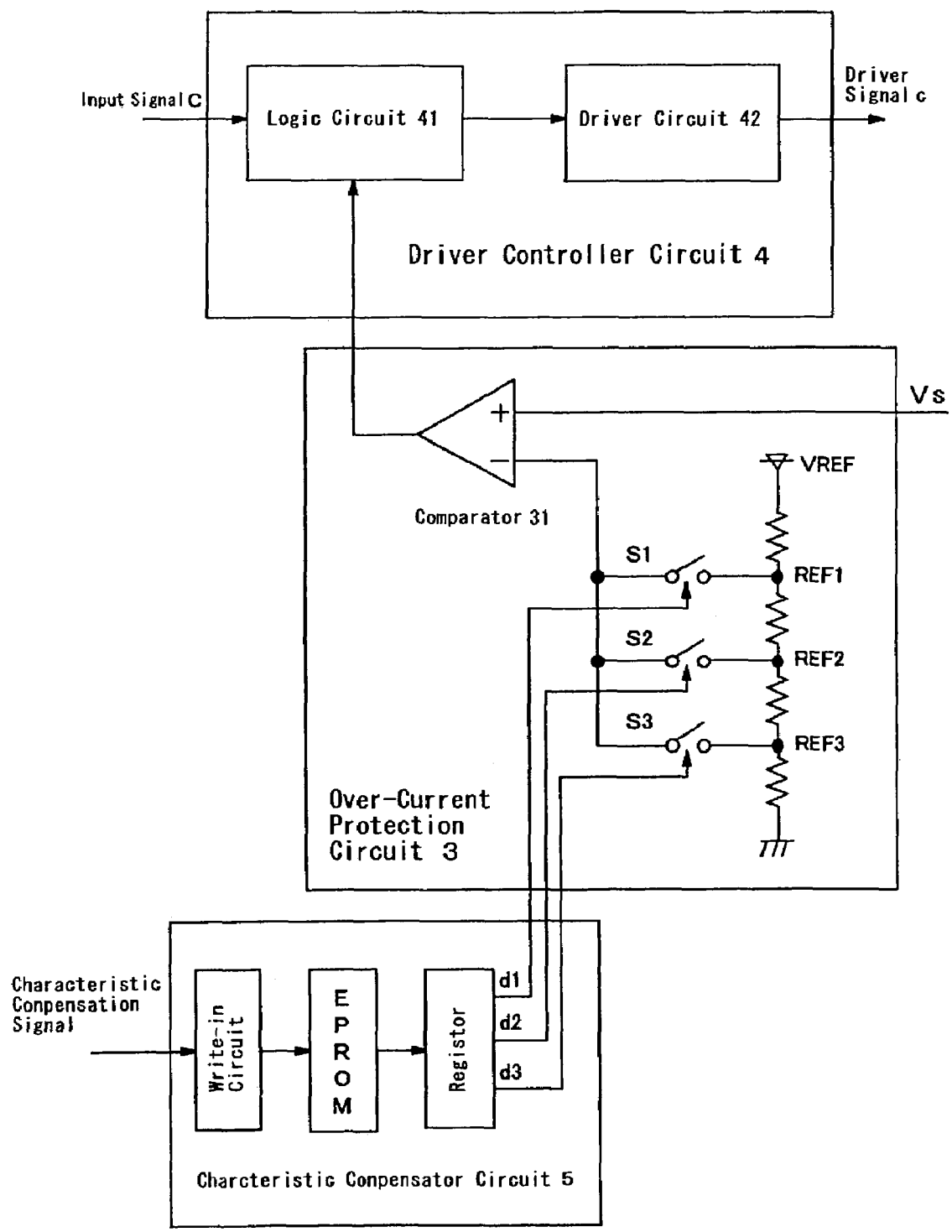
FIG. 5 is a circuit diagram having shown the details of FIG. 4.

As described, the trip level or the emitter shunting ratio predetermined in the sense resistor Rs and the over-current protection circuit 3 is varied between different units. This will discourage the over-current protection thus providing inadequate protection from the short-circuit. The present invention allows the trip level to be favorably selected from Vref1, Vref2, and Vref3 on the basis of actual measurements, as shown in FIG. 6. As a result, the overcurrent protection can correctly be carried out. The number of the trip levels from which the optimum is selected is not limited to three.

Embodiment 3

Figure 7:
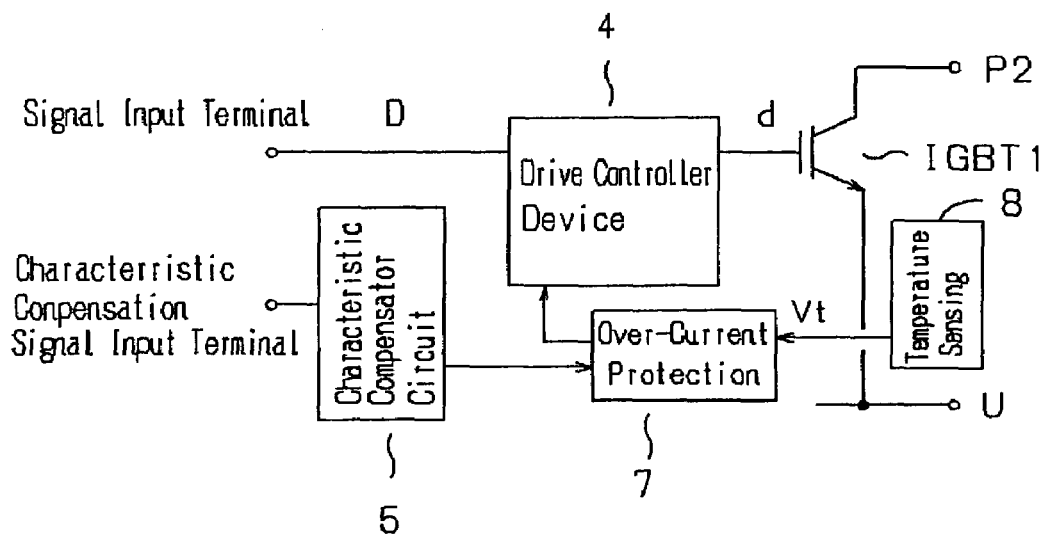
FIG. 7 is a controller block diagram showing a third embodiment of the present invention.
Figure 8:
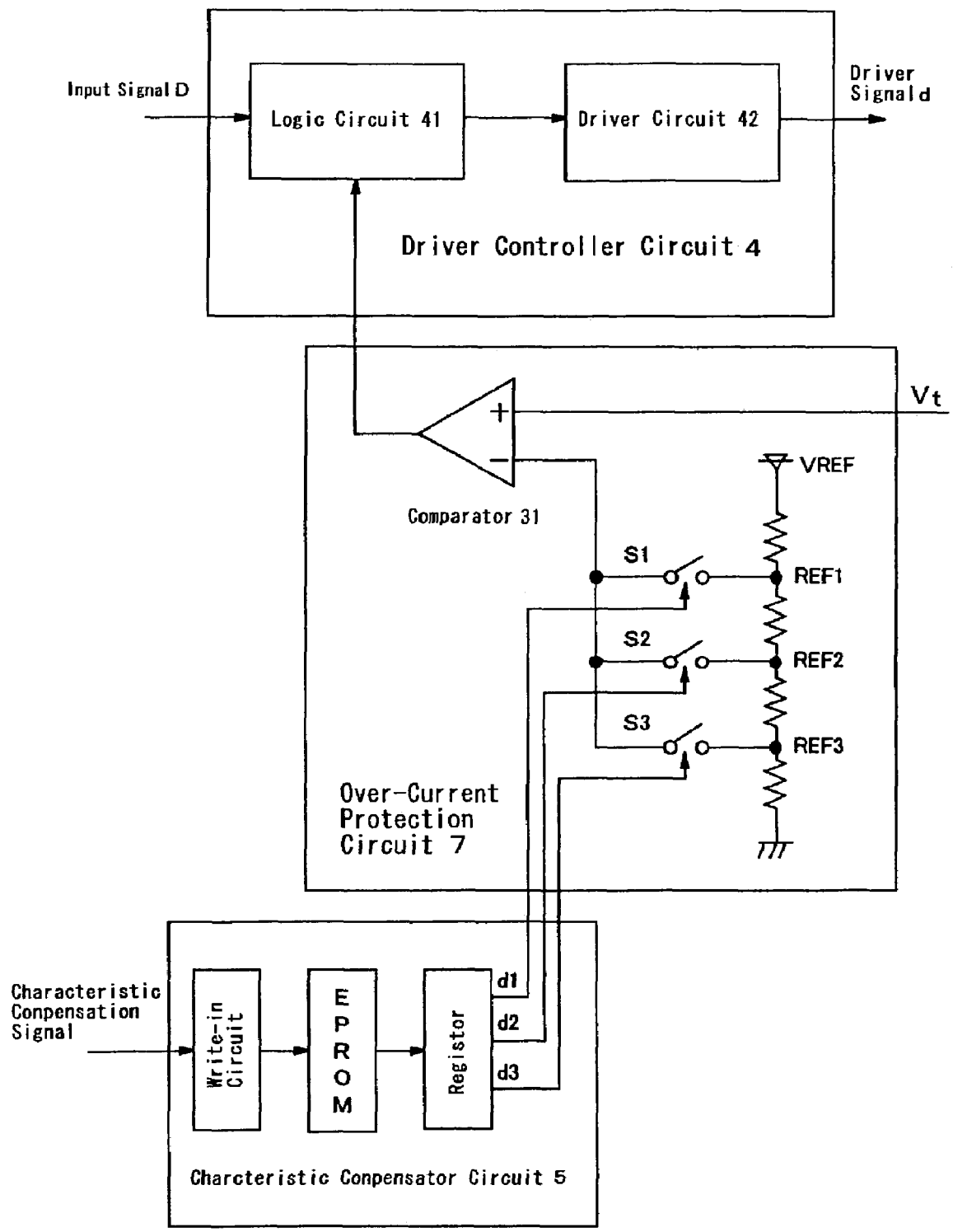
FIG. 8 is a circuit diagram having shown the details of FIG. 7.

FIG. 7 is a controller block diagram showing the third embodiment of the present invention. FIG. 8 illustrates details of FIG. 7. Throughout FIGS. 7 and 8, like components are denoted by line numerals. An over-current protection circuit 7 is substantially identical in the arrangement to the over-current protection circuit 3. In particular, its comparator 71 receives at the non-inverting input terminal a temperature signal Vt from a temperature sensing means 8.

When the temperature of the IGBT1 in operation increases and the temperature signal Vt exceeds a predetermined trip level, the disconnection signal is delivered to the drive controller circuit 4 where the drive signal d generated from the input signal D is thus disconnected. There are yet variations in the trip level for over-temperature protection and the measurement of the temperature sensing means 8 in the over-current protection circuit 7, hence permitting no precise over-temperature protection.

Figure 9:
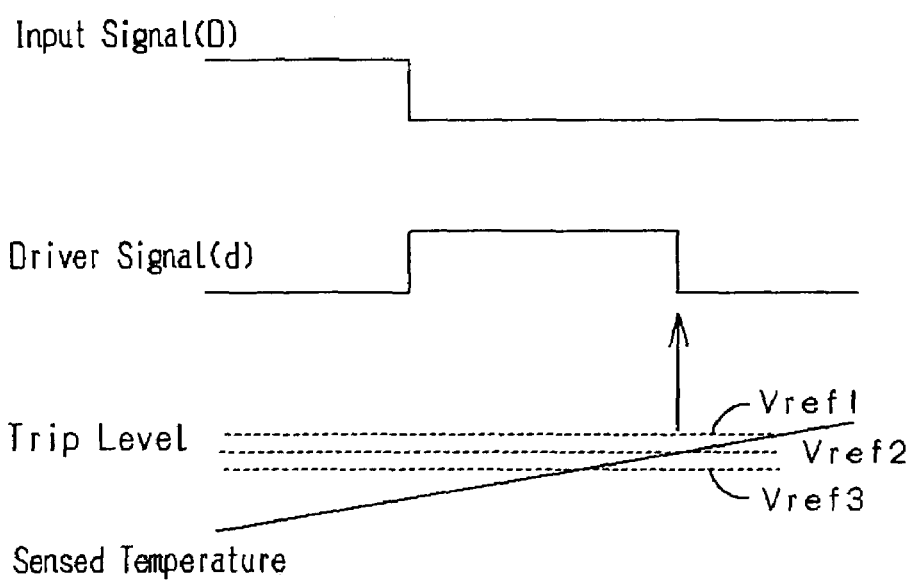
FIG. 9 is a timing chart of signals shown in FIG. 7.

This embodiment allows the trip level to be favorably selected from Vref1, Vref2, and Vref3, as shown in FIG. 9. As the trip level is controlled to an optimum setting from the actual measurements, the over-temperature protection can be carried out at higher precision.

Embodiment 4

Figure 10:
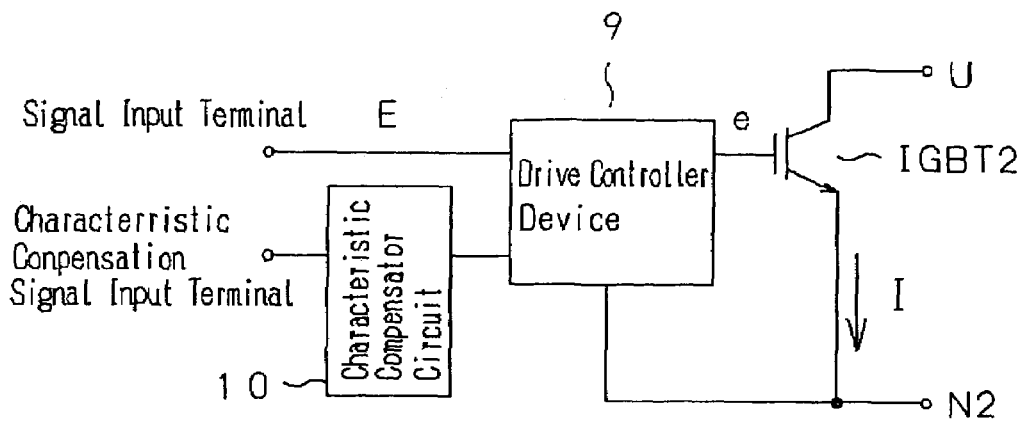
FIG. 10 is a controller block diagram showing a fourth embodiment of the present invention.
Figure 11:
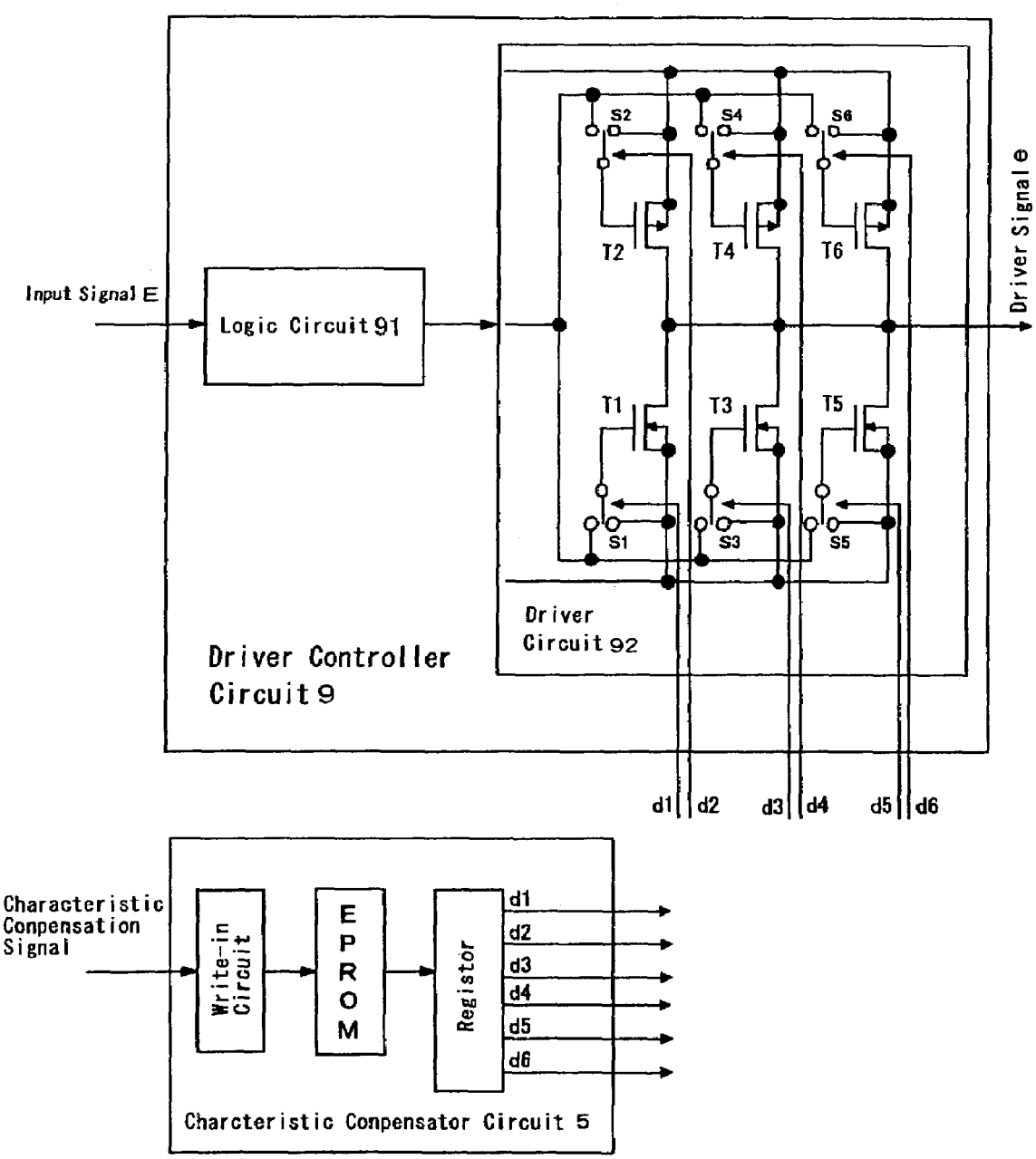
FIG. 11 is a circuit diagram having shown the details of FIG. 10.
Figure 13:
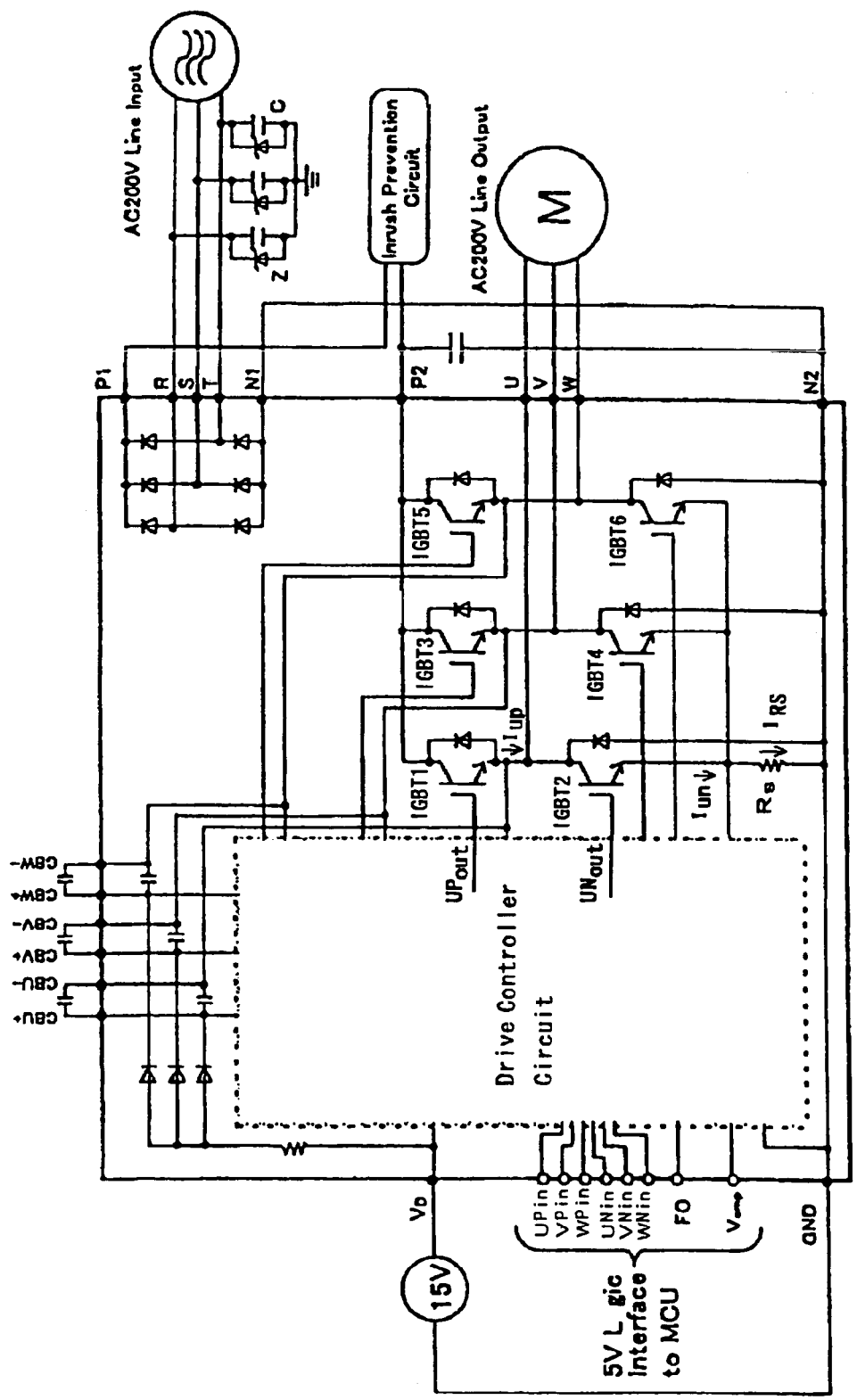
FIG. 13 is a circuitry diagram showing a conventional power module.

FIG. 10 is a controller block diagram showing the fourth embodiment of the present invention. FIG. 11 illustrates details of FIG. 10. A drive controller circuit 9 comprises a logic circuit 91 for transferring an input signal E as a logic signal and a driver circuit 92. Each of n-type FET transistors T1, T3, and T5 is connected at the drain to the output terminal of the drive controller circuit 9. Their gates can be connected by the action of corresponding switches S1, S3, and S5 to the output terminal of the logic circuit 91 or their own sources.

Similarly, each of p-type FET transistors T2, T4, and T6 is connected at the drain to the output terminal of the drive controller circuit 9. Their gates can be connected by the action of corresponding switches S2, S4, and S6 to the output terminal of the logic circuit 91 or their own sources. The switches S1 to S6 are operated with corresponding signals d1 to d6 received from a register provided in a characteristic compensator circuit 10.

As timed with the fall of the input signal E, one of the transistors T1, T3, and T5 connected to the output terminal of the logic circuit 91 is driven. When the input signal E rises, one of the transistors T2, T4, and T6 connected to the output terminal of the logic circuit 91 is driven. The sum of current outputs of the driven transistors is released as a drive signal e.

Figure 12:
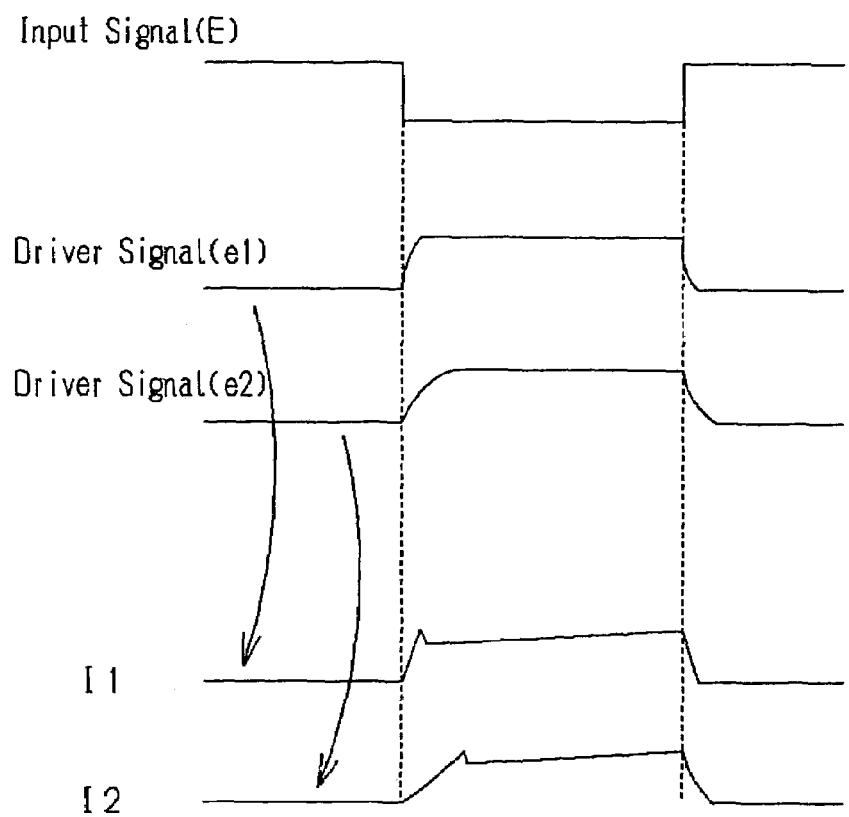
FIG. 12 is a timing chart of signals shown in FIG. 10.

This action is illustrated in the timing chart of FIG. 12. A drive signal e1 is a combination of the outputs of the two transistors T1 and T2. Also, a drive signal e2 is a combination of the outputs of the two transistors T3 and T4. As apparent, the combination of the two transistors T3 and T4 is greater in the driving force than that of the transistors T1 and T2. Accordingly, the drive signal e2 can be more moderate at the rise and fall edges than the drive signal e1. Denoted by I1 and I2 are corrector currents of the IGBT2 with the drive signals e1 and e2 respectively.

In the prior art, the driving force of the drive controller circuit has to be modified depending on the current capacity of each IGBT. This embodiment allows the driver to be favorably selected from a group of transistors having different driving capacities to determine an optimum gradient at the rise or fall of the corrector current (output) of the IGBT2. Also, the characteristic compensator circuit 10 includes an EPROM which may be a nonvolatile memory or one-time ROM and may be installed in an integrated circuit form in the drive controller circuit 9.

A set of the transistors to be driven is not limited to T1-T2, T3-T4, and T5-T6 but may be any pair such as T1-T4 or any combination such as (T1+T3)-(T2+T4).

As defined in claim 2, the delay time of the semiconductor switching elements is set to a desired length in the driver circuit to eliminate its discrepancies. Accordingly, the setting of input cancel period (Tdead) can be unnecessary and the inverter controlling action can be carried out at higher precision.

As defined in claim 3, the trip level used for judging the over-current can arbitrarily be determined to a desired setting, hence allowing a higher degree of the protection against short-circuits.

As defined in claim 5, the driver circuit includes a plurality of driving devices which are different in the current capacity so that optimum one can be selected from the driving devices. Accordingly, the gradient at the rise and fall of the corrector current of the semiconductor switching element can arbitrarily be determined.

What is claimed is:

1. A semiconductor device comprising:
   a semiconductor switching element;
   a current detecting means for detecting the current flowing across the semiconductor switching element;
   an over-current protecting means for canceling an action of said semiconductor switching element when a detection signal from the current detecting means exceeds a predetermined trip level;
   a drive controlling means for delivering a drive signal to the semiconductor switching element unless the detection signal exceeds the predetermined trip level is exceeded; and
   a characteristic compensating means for selecting said predetermined trip level by selecting a reference voltage from a plurality of reference voltages to determine said pre-determined trip-level, the selecting based on which of the plurality of reference voltages exceeds a value of the detection signal measured by the current detecting means.

2. The semiconductor device according to claim 1, wherein the semiconductor switching element comprises plural emitters.

3. The semiconductor device according to claim 1, wherein the drive controlling means comprises:
   logic means for transferring an input signal as a logic signal unless the predetermined trip level is exceeded, and
   means responsive to the logic signal for delivering the drive signal to the semiconductor switching element.

4. A semiconductor device comprising:
   a semiconductor switching element;
   a current detecting means for detecting the current flowing across the semiconductor switching element;
   an over-current protecting means for canceling an action of said semiconductor switching element when a detection signal from the current detecting means exceeds a predetermined trip level;
   a drive controlling means for delivering a drive signal to the semiconductor switching element unless the predetermined trip level is exceeded; and
   a characteristic compensating means for selecting said predetermined trip level by selecting a reference voltage from a plurality of reference voltages to determine said pre-determined trip-level, the selecting based on which of the plurality of reference voltages exceeds a value of the detection signal measured by the current detecting means,
   wherein said characteristic compensating means comprises at least one of a nonvolatile memory or one-time ROM provided in an integrated circuit form.

5. The semiconductor device according to claim 4, wherein the semiconductor switching element comprises plural emitters.

6. The semiconductor device according to claim 4, wherein the drive controlling means comprises:
   logic means for transferring an input signal as a logic signal unless the predetermined trip level is exceeded, and
   means responsive to the logic signal for delivering the drive signal to the semiconductor switching element.

7. A semiconductor device comprising:
   a semiconductor switching element;
   a current detector configured to detect a current flowing across the semiconductor switching element;
   an over-current protection circuit configured to cancel an action of said semiconductor switching element when a detection signal from the current detector exceeds a predetermined trip level;
   a drive controller configured to deliver a drive signal to the semiconductor switching element unless the predetermined trip level is exceeded; and
   a characteristic compensator circuit configured to select said predetermined trip level to a value greater than a sense voltage associated with the current flowing across the semiconductor switching element being protected by the over-current protection circuit, said characteristic compensator circuit configured to select said trip level by selecting a reference voltage from a plurality of reference voltages to determine said pre-determined trip-level, the selecting based on which of the plurality of reference voltages exceeds a value of the sense voltage associated with the current flowing across the semiconductor switching element.

8. The semiconductor device according to claim 7, wherein the semiconductor switching element comprises plural emitters.

9. The semiconductor device according to claim 7, wherein the drive controller comprises:
   a logic circuit configured to transfer an input signal as a logic signal unless the predetermined trip level is exceeded, and
   a driver circuit responsive to the logic signal and configured to deliver the drive signal to the semiconductor switching element.

10. A semiconductor device comprising:

a semiconductor switching element;

a current detector configured to detect a current flowing across the semiconductor switching element;

an over-current protection circuit configured to cancel an action of said semiconductor switching element when a detection signal from the current detector exceeds a predetermined trip level;

a drive controller configured to deliver a drive signal to the semiconductor switching element unless the predetermined trip level is exceeded; and a characteristic compensator circuit configured to select said predetermined trip level to a value greater than a sense voltage associated with the current flowing across the semiconductor switching element being protected by the over-current protection circuit, said characteristic compensator circuit configured to adjust said predetermined trip level by selecting a reference voltage from a plurality of reference voltages to determine said predetermined trip-level, the selecting based on which of the plurality of reference voltages exceeds a value of the sense voltage associated with the current flowing across the semiconductor switching element, wherein said characteristic compensator circuit comprises at least one of a nonvolatile memory or one-time ROM provided in an integrated circuit form.

11. The semiconductor device according to claim 10, wherein the semiconductor switching element comprises plural emitters.

12. The semiconductor device according to claim 10, wherein the drive controller comprises:

a logic circuit configured to transfer an input signal as a logic signal unless the predetermined trip level is exceeded, and a driver circuit responsive to the logic signal and configured to deliver the drive signal to the semiconductor switching element.

* * * * *